(12) United States Patent
Tunaboylu et al.

(10) Patent No.: US 7,638,028 B2
(45) Date of Patent: Dec. 29, 2009

(54) PROBE TIP PLATING

(75) Inventors: Bahadir Tunaboylu, Shandler, AZ (US); Edward L. Malantonio, Conshohocken, PA (US); David T. Beatson, Kennett Square, PA (US); Andrew Hmiel, Glenside, PA (US)

(73) Assignee: SV Probe Pte. Ltd., Singapore (SG)

( * ) Notice: Subject to any disclaimer, the term of this patent is extended or adjusted under 35 U.S.C. 154(b) by 702 days.

(21) Appl. No.: 11/196,194

(22) Filed: Aug. 3, 2005

(65) Prior Publication Data

US 2006/0027747 A1    Feb. 9, 2006

Related U.S. Application Data

(60) Provisional application No. 60/599,492, filed on Aug. 5, 2004.

(51) Int. Cl.
C25D 5/06 (2006.01)
C25D 17/00 (2006.01)

(52) U.S. Cl. .................. 205/117; 205/134; 204/198; 204/225

(58) Field of Classification Search .......... 205/117, 205/122, 134, 135; 204/224 R
See application file for complete search history.

(56) References Cited

U.S. PATENT DOCUMENTS

| 4,702,811 A * | 10/1987 | Murata et al. ............ 204/206 |
| 5,348,638 A * | 9/1994 | Nakagawa ................ 205/122 |
| 5,892,223 A * | 4/1999 | Karpov et al. ............ 250/306 |
| 6,270,646 B1 * | 8/2001 | Walton et al. ............ 205/93 |
| 6,359,337 B1 | 3/2002 | Keukelaar |
| 6,913,681 B2 | 7/2005 | Matsuda et al. |
| 2003/0129866 A1 | 7/2003 | Romano et al. |
| 2003/0178321 A1 * | 9/2003 | Buchler ................... 205/668 |
| 2004/0016636 A1 * | 1/2004 | Yang et al. ................ 204/237 |
| 2004/0247920 A1 * | 12/2004 | Armstrong et al. ........ 428/544 |

FOREIGN PATENT DOCUMENTS

| JP | 03209738 A | 12/1991 |
| WO | WO 03/081725 A | 10/2003 |

OTHER PUBLICATIONS

"The Materials Properties and Contact Reliability of Palladium-cobalt", J.A. Abys et al., *Trans. IMF*, pp. 164-168, 77(4), 1999.

"Electroplating of PdCo Alloy for Connector Application," I. Boguslavsky et al., *Proc. 29th IICIT Connector and Interconnection Symposium*, Bell Laboratories, Lucent Technologies, pp. 219-236, 1996.

(Continued)

*Primary Examiner*—Nam X Nguyen
*Assistant Examiner*—Luan V Van
(74) *Attorney, Agent, or Firm*—Hickman Palermo Truong & Becker LLP; Edward A. Becker

(57) ABSTRACT

A method of processing a probe element includes (a) providing a probe element comprising a first conductive material, and (b) coating only a tip portion of the probe element with a second conductive material.

16 Claims, 5 Drawing Sheets

OTHER PUBLICATIONS

International Preliminary Examining Authority, "Notification of Transmittal of the International Preliminary Report on Patentability," PCT/US2005/027574, dated Nov. 24, 2006, 6 pages.

Current Claims, PCT/US2005/027574, 3 pages.

European Patent Office, "Communication Pursuant to Article 96(2) EPC," App. No. 05778915.8, dated May 21, 2007 2 pages.

Current Claims, App. No. 05778915.8, 2 pages.

* cited by examiner

PROBE TIP PLATING

RELATED APPLICATION

This application is related to and claims priority from U.S. Provisional Patent Application No. 60/599,492, filed Aug. 5, 2004, which is incorporated herein by reference in its entirety.

FIELD OF THE INVENTION

The present invention relates to probes for wafer testing and, more particularly, to an improved probe tip with a plating layer that provides decreased wear and increased durability.

BACKGROUND

Probes are used as interconnects for providing electrical communication between a device under test (DUT) and a testing apparatus. Conventional probes are typically formed from a base material, such as beryllium-copper (Be—Cu), and have one or more outer layers formed on the base material. In some cases, no plating is applied to the probes. Those outer layers of plating when applied have included, for example, plated layers of nickel, gold, or rhodium and palladium (with or without cobalt). The outer layers have generally been added to increase the hardness and decrease wear of the probe. The increased hardness is typically provided to break through an oxide layer that forms on the contact pads being tested. The oxide layer adversely affects the electrical conductivity between the pad or bump and the probe and, thus, it is desirable for the probe to pierce the oxide layer in order to achieve an improved electrical connection.

In certain conventional probes, the outer plating layers have been formed on the entire probe. This has several drawbacks. First, coating the entire probe is costly. Second, the plating on the probe can negatively affect the mechanical characteristics of the probe and, in particular, the spring characteristics of the probe. Third, a very hard coating on the spring part/section of the probe may peel off during cycling operation of a probe.

Thus, it would be desirable to provide an improved plated probe which is less expensive to manufacture and provides increase durability, while minimizing alterations in the probe spring characteristics.

SUMMARY OF THE INVENTION

According to an exemplary embodiment of the present invention, a method of processing a probe element is provided. The method includes providing a probe element including a first conductive material. The method also includes coating only a tip portion of the probe element with a second conductive material.

According to another exemplary embodiment of the present invention, a coating system for applying a coating to only a tip portion of a probe element is provided. The coating system includes a container for holding a coating material. The coating system also includes a porous plate adjacent the container for receiving a portion of the coating material during a coating process. The porous plate is configured to position the portion of the coating material adjacent a surface thereof. The portion of the coating material is configured to be contacted by the tip portion of the probe element during the coating process.

According to yet another exemplary embodiment of the present invention, a probe card assembly is provided. The probe card assembly includes a probe substrate and a plurality of probe elements supported by the probe substrate. Each of the probe elements includes a first conductive material, and only a tip portion of each of the probe elements is coated with a second conductive material.

The probe elements may be supported by the probe substrate in any of a number of configurations, for example, each of the probe elements may be (a) directly mechanically bonded to respective conductive regions of the probe substrate, or (b) supported by a probe head such that the probe elements are moveable with respect to conductive regions of the probe substrate.

The probe card assembly may include a number of other elements, for example, a PCB, an interposer, etc.

DETAILED DESCRIPTION OF THE INVENTION

Figure 1:
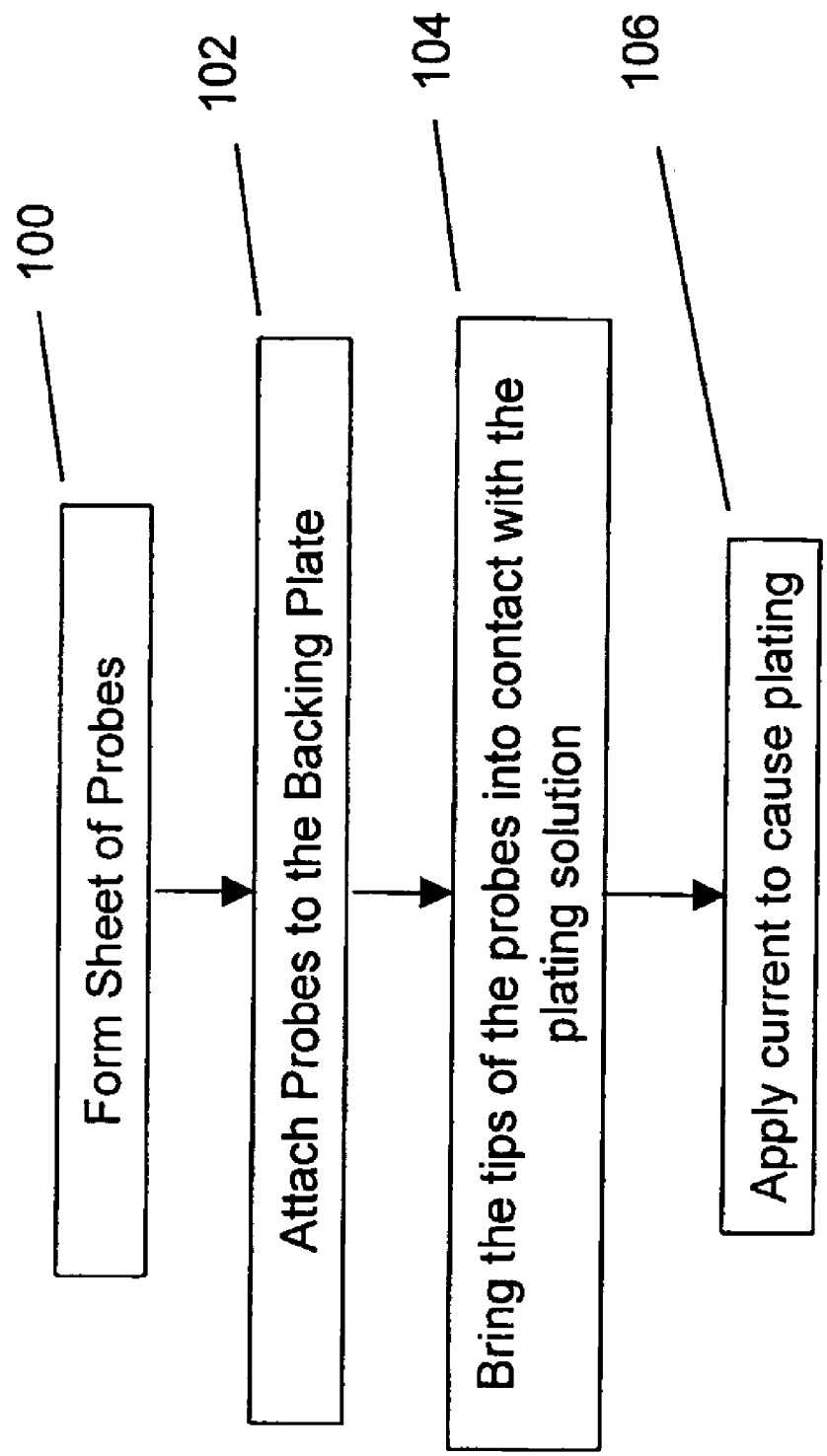
FIG. 1 is a flow chart providing a general overview of a process for coating a probe tip in accordance with an exemplary embodiment of the present invention.

The present invention relates to a method of forming a coating on a probe tip, for example, where the probe is part of a probe card assembly for testing of integated circuits. The coating is applied to a select region of the probe, for example, the probe tip. The coating may be configured to provide increased hardness and wear protection while minimizing cost and alterations in the spring characteristics of the probe.

As used herein, the terms "probe," "probe pin," and "probe element" refer to a contact element configured to contact a semiconductor device to be tested. Exemplary probes include wire bonded contact elements, pick and place type contact elements, plated-up contact elements, and any of a number of other contact element structures configured to contact a semiconductor device to be tested (e.g., through contact pads or the like on the semiconductor device).

The "probe tip" or the "tip portion" of the probe element, as described herein, refers to the portion of the probe element that is configured to be coated according to the present invention. Practically, only a very small percentage of the length of the probe element is coated to provide the desirable tip qualities (e.g., resistance to wear); however, in order to assure that the tip portion has been properly coated (e.g., using a camera or vision system or the like), it may be desirable that a somewhat larger portion of the probe element act as the tip portion being coated. According to certain exemplary embodiments of the present invention, the tip portion being coated is less than 50% of the length of the probe element. In other embodiments, the tip portion being coated is less than 25% of the length of the probe element. In still further embodiments, the tip portion being coated is less than 10% of the length of the probe element.

In wafer testing applications, probe tip coating or plating in accordance with the present invention may facilitate thermally stable cycling of the electrical connections (i.e., the cyclical electrical connections made during wafer testing), where a substantially non-oxidizing and/or non-corroding coating on a probe tip is desirable at high temperatures during wafer test. In certain exemplary embodiments of the present invention, it is also desirable to have a probe tip material that deters adherence of contaminants (e.g., scrubbed bond pad material, solder bump material, etc.) while providing good contact resistance. The design and operation of the probe makes provisions for the scrubbing action of the probe tip onto the tested metal, and the function of the bond pad is to form connections to the internal parts of the device. To the degree that the probe tip may make a reliable, low resistance connection with minimal deformation of the pad by decreasing the wear under the designed scrubbing function, the probe marks remaining on the pad would then be reduced and the probe mark effect on wirebonding to the bond pad would be minimized.

The present invention is applicable to a wide variety of probe tips, including pyramid, pointed cone, wedge, or other probe tips, and has particular applicability to probe tips with diameters of less than 10 µm. Due to their small size, such probe tips are particularly benefited from a hardened tip to prevent wear and to increase durability. One of the benefits of reducing tip wear is that there is a reduction in the formation of small particles that could interfere with the electrical contact resistance.

As discussed above, certain prior coating methods coat the entire probe with an outer coating. The coating process typically causes the coating material to wick up the entire length of the probe. The present invention, in contrast, provides a novel process for applying an outer layer coating to a probe tip so as to result in substantially only the tip being coated. The process also permits selective control of the coating. The process overall is less costly and faster to apply since it results in placing the desired material on only a small portion of the probe. The resulting coating has a lower coefficient of friction, thus reducing adhesion of foreign matter.

Figure 2:
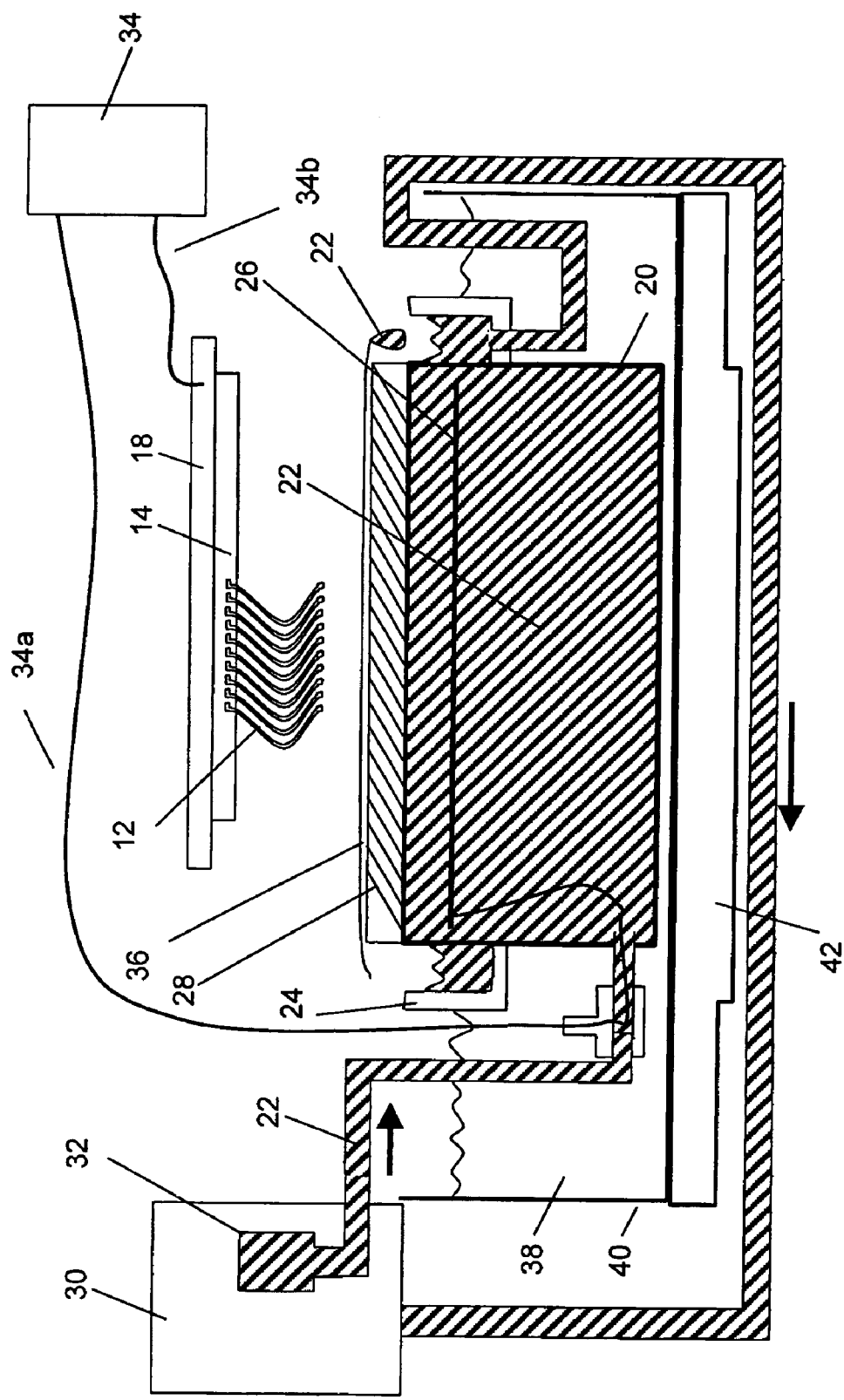
FIG. 2 is a schematic representation of a process for forming a probe tip in accordance with an exemplary embodiment of the present invention.

Referring to FIGS. 1 and 2, an exemplary embodiment for coating the probe tips is schematically depicted. At step 100, a sheet of probes 12 are formed and provided in an array on a sheet 14, for example, through the use of a conventional probe forming process, such as a lithographic process. The formation of probes through the use of lithographic techniques is well known to those skilled in the art. A typical process involves laminating the desired material, masking the laminated material to define the fine product shape, UV imaging of the masked material, removing the mask and then developing the imaged material. The probes are then formed within the boundaries of the revealed resist pattern using a plate up process.

After formation, the sheet 14 may be divided into rows of probes 12, although it is not necessary to do so in order to practice the present invention. At step 102 in FIG. 1, the row of probes 12 are then attached to a backing plate or other suitable support 18. The backing plate 18 may be made, for example, from a stainless steel material that provides sufficient stiffness for supporting and handling the probes 12 during the coating process. The attachment of the probes 12 to the backing plate is electrically conductive so as to permit transmission of current between the probes 12 and the backing plate 18 as will be discussed in more detail below. In one exemplary embodiment of the present invention, a spring-loaded clamping arrangement is used that applies a conductive attachment so that the strip of probes may be readily removed from backing plate (and another strip of probes reinserted) for swift productivity.

Typically, the base sheet of the probes is of the same thickness as the probes, for which the area and length are considered too thin to provide adequate thickness for support during the coating operation. For that reason (and others), a backing plate 18 may be used.

In an exemplary embodiment of the present invention, the coating operation can be performed in conjunction with the final product, such as a probe card, with a substrate 14 (e.g., multilayer ceramic or multilayer organic or single layer ceramic) with the 12 probes connected to a PCB 18 (e.g., via an interposer or attached directly). The electrical connections of pins/probes can be accomplished by shorting the PCB traces/pins on the top by an electrically conductive cloth or some other wiring fixture.

As shown in FIG. 2, a non-conductive container 20, such as an high density polyethylene container, is used to store a desired coating solution 22. While a durable plastic container may be preferred, it is also contemplated that the container 20 can be made from other materials such as a ceramic or glass material. The illustrated exemplary container 20 is located within a catch pan 24.

In one embodiment, a layer of conductive foam 26 is placed across the top of the container. The foam 26 is made, for example, from an aluminum material. The foam layer 26 is designed to permit an electroplating solution to pass through. This is intended as the anode electrode that defines one boundary of the electric field within the electrolyte. An exemplary foam thickness may range from 2 to 12 mm depending on the overall scale of the plating system. The foam 26 is electrically connected through the wall of the container 20 so that it can be connected to a power source 34.

In another exemplary embodiment of the present invention, the electrode is made from a platinum screen or net of wire to perform the field boundary and to allow the plating solution to pass through. The area of an exemplary anode is in the range of 1 to 2 times the area of the surface to be plated. On top of the anode is a thin porous ceramic plate 28. The porosity of the plate 28 is designed to permit the plating solution to percolate out of the container 20 onto the top surface of the plate 28. Porous ceramics with porosities ranging from 1 to 10 micrometers such as those from Refractron Technologies Corporation, Newark, N.Y. have been successfully implemented. The material at this position acts as an insulator between the anode and the probes 12 to be plated (the cathode). Various ceramic materials (and other materials) can be cost effectively manufactured with the desired porosity and stiffness properties. The ceramic plate 28 is attached either to the anode 26 or placed directly to the container top 20. The ceramic plate 28 may be removable from the container 20 so as to be replaceable. The porous ceramic 28 may be periodically cleaned as is desired.

A desired plating solution 22 is placed within or pumped into the container 20. In one exemplary embodiment of the present invention, the plating solution 22 is a palladium cobalt solution. An exemplary ratio of Pd to Co is 80/20 by weight. (Additional information on the material properties and contact reliability of palladium cobalt can be found in J. A. Abys, E. J. Kudrak and C. Fan, "The Material Properties and Contact Reliability of Palladium Cobalt," *Trans. IMF*, 77(4), pages 164-168, 1999, which is incorporated herein by reference in its entirety.) According to an exemplary embodiment of the present invention, the process is run for 10-15 minutes to achieve a coating thickness of approximately 3-5 micrometers. Another exemplary plating solution is PdNi (e.g., 80/20 by weight.) PdCo may offer less porosity and superior finish on the probe surface than other typical coatings. It has a fine grain structure and has a low coefficient of friction (compared to hard gold, for example), which makes the surface slippery for a probe and prevents adhering metal debris from the contact pad. PdCo tip plating offers thermal stability of the probes for contact resistance and offers better probing performance due to the reduction or elimination of debris buildup on the probe tips during repeated touchdowns on contacts/terminals such as solder bumps (for example, on PbSn, Cu or SnAgCu bumps and Al or Cu pads on wafers). For example, PdCo plating has a Vickers hardness of HV 600. By comparison, the hardness of BeCu is only HV 350 and the hardness Au (hard) is only HV 150. For thermally stable cycling of electrical connections, a non-oxidizing and non-corroding coating on probe tips is desired during high temperature wafer testing. It is also desirable to have a probe tip material that deters adherence of contaminants, such as solder bump material, while providing good contact resistance.

Additional information on PdCo plating can be found in "Electroplating of PdCo Alloy for Connector Application," *Proc. 29th IICIT Connector and Interconnection Symposium*, p. 219-236, 1996, authored by Boguslavsky, Abys and Eckert, which is incorporated herein by reference in its entirety. Furthermore, a layer of Au can be used between a PdCo plating and a BeCu or Ni-alloy base probe.

Referring again to FIG. 2, a pump 30 is connected to the container 20 and is used to provide a continuous flow of plating solution 22 into the container so as to cause the plating solution 22 to pass through the anode 26 (e.g., the conductive foam 26) and the ceramic plate 28. After passing through the ceramic plate 28 the excess plating solution 22 drains off the ceramic plate 28 and into the catch pan 24. The pump 30 can also be used to recycle the excess solution 22 from the catch pan 24. A plating solution reservoir 32 may be connected to the pump 30 through a fluid conduit for providing a source of additional plating solution.

A power source 34, such as a battery, is provided and includes positive and negative terminals. The positive terminal is connected through a wire 34a to the anode 26 (either directly or through a connection to the container 20.) The negative terminal is connected through a wire 34b to the probes 12. An exemplary method for electrically connecting the probes 12 to the negative terminal is by attaching the wire to the conductive backing plate 18. Alternatively, a conductive layer (not shown) could be formed on the backing plate 18 which contacts the probes 12.

At step 104 of FIG. 1, in order to plate the probe tips, the backing plate 18 is lowered so as to bring the probes 12 into contact with the fiber sheets 36 on top of the ceramic plate 28. Once the probe tips contact the fiber sheets 36, the plating solution 22 wets the tip of the probes 12. In one embodiment of the invention, during plating process, the plating solution 22 is maintained at approximately 50 degrees C., by using water bath 38 held in glass bowl 40 warmed by hotplate 42, while the electrical system is held at approximately 4 volts and the current density at approximately 10 asf.

Once the plating solution 22 has been pumped through to the top of the porous ceramic plate 28, the solution 22 will fill to a height determined by the surface tension at the edge of the ceramic plate 28. In order to dip the probe tips onto a surface so that only the tip will be wetted by the plating solution 22, the fiber sheet 36 is set onto the ceramic plate 28. The fiber sheet 36 may be, for example, cellulose or other synthetic fiber similar to those used as filter papers. An example is a material from Whatman International Ltd., Clifton, N.J. It has been found experimentally that a combination of these fiber sheets 36 are effective in the regulation of the surface tension that predisposes a fluid (e.g., the plating solution 22) to flow up between the probes 22 by capillary action. Flow up between the probes 12 is typically not desired because a much longer length of the probe 12 will become plated which can affect the mechanical properties of the probe 12, and uses larger amounts of plating solution 22. In order to minimize the surface tension of the plating solution 22 so as to prevent or minimize wicking of the plating solution 22 between the probes 12, the thin sheet 36 (or a combination of these fiber sheets) of non-conductive material 36 may be placed on top of the ceramic plate 28. Suitable alternative exemplary non-conductive sheets include nylon, polycarbonate, and glass. Once the tips are lowered onto the fiber sheet(s) 36, the soft contact allows the fluid 22 to wet the tip (with an electrical current applied as shown in step 106 of FIG. 1), without subjecting the probe 12 to any appreciable compressive forces.

An arrangement with a device such as a microscope or a camera (e.g., on a rail that can slide parallel to the strip) that views the tips as they touch down on the wet fiber sheet 36 can be used to ascertain the strips parallelism and adjust it so that the tips are substantially wet uniformly.

Figure 3:
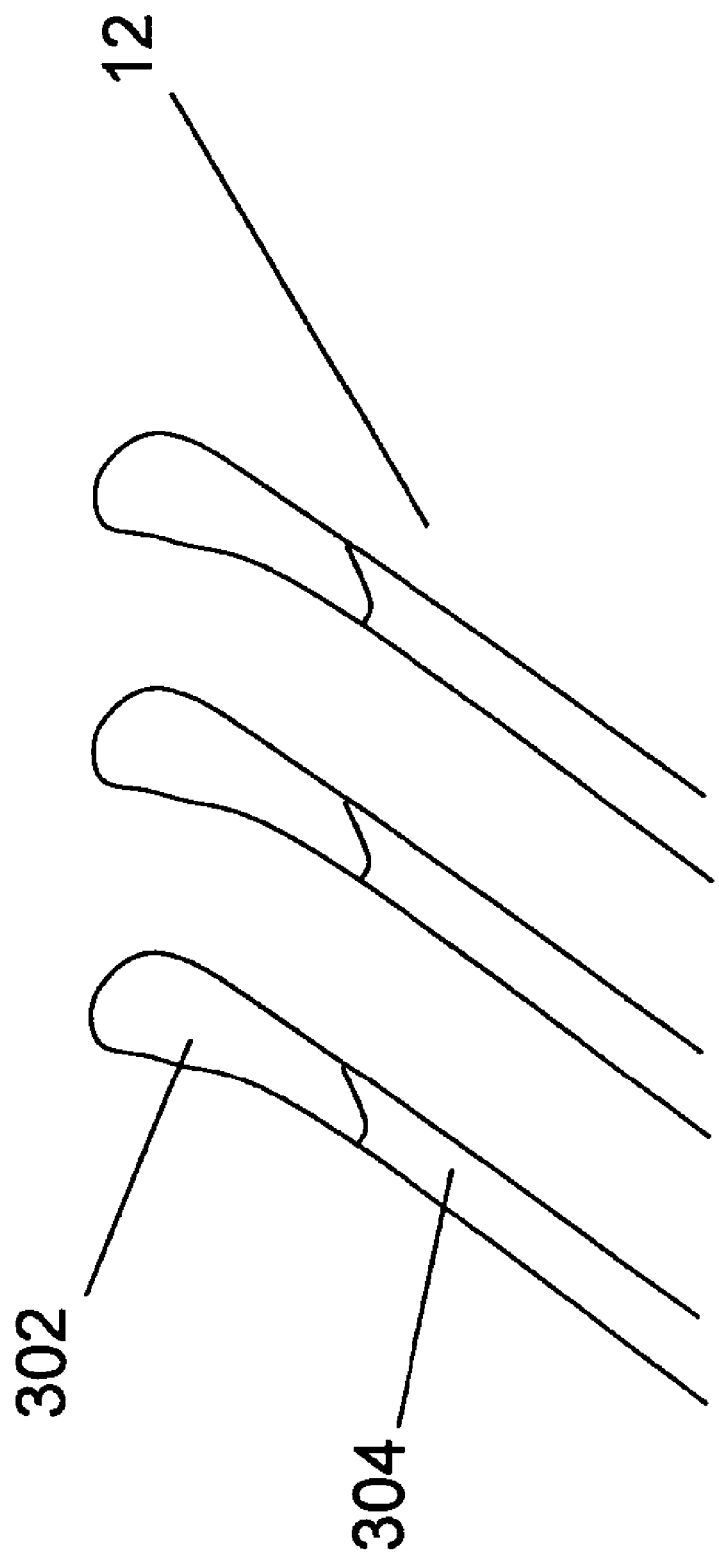
FIG. 3 is a schematic representation of probe tips covered with a plating layer in accordance with an exemplary embodiment of the present invention.

FIG. 3 illustrates several probes 12 with probe tips plated in accordance with am exemplary embodiment of the present invention. The plating 302 can be seen extending from the tip only a short distance along the probe body 304.

Figure 4:
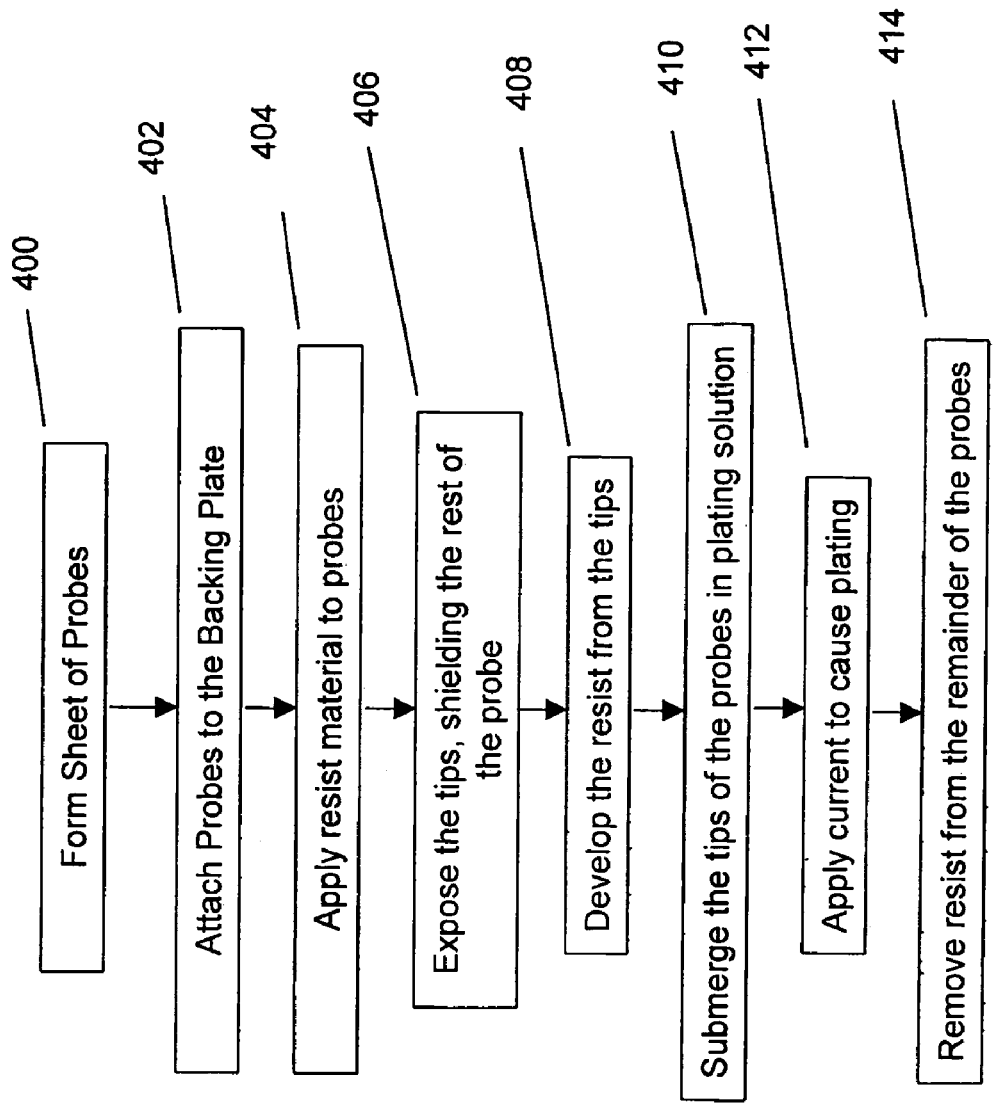
FIG. 4 is a flow chart illustrating a process for coating a probe tip in accordance with an exemplary embodiment of the present invention.
Figures 5, 6:
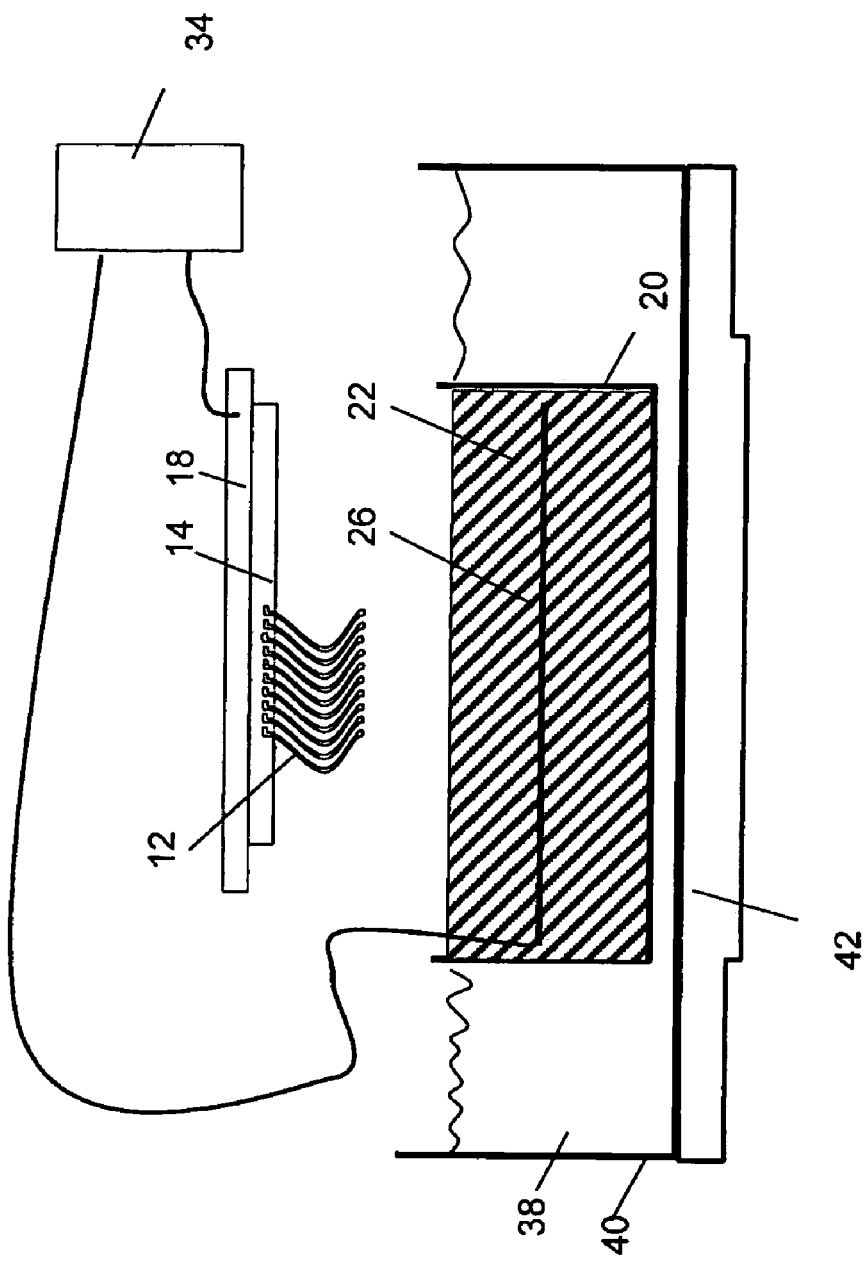
FIG. 5 is a schematic representation of the process of FIG. 4.
FIG. 6 is a cross-section of a portion of a probe with a resist coating formed on the probe body prior to plating in accordance with an exemplary embodiment of the present invention.

Another exemplary process for forming a plated tip probe is shown in connection with FIGS. 4-6. The process involves the formation of the probes 12 (at step 400 illustrated in FIG. 4) in a similar manner as discussed above. The probes 12 are also shown as being attached to a backing plate 18 (at step 402 illustrated in FIG. 4), again as discussed above.

Next, referring to FIG. 6 (and step 406 in FIG. 4), in order to assure that the coating is applied only to the tips of the probes 12, a resist coating 52 may also be applied to the probes prior to coating step. The resist coating 52 is optional and the resist coating may be applied, for example, through a lamination process. One example of a resist coating 52 suitable for use in the present invention is NIT215 or NT250 dry films available from Morton Electronic Materials Chicago, Ill. or Intermountain Circuit Supply, Scottsdale, Ariz. The resist coating 52 may be formed with a thickness of between approximately 30 μm and 50 μm, and the resist coating 52 may be applied in a sheet form of a photodefinable material so as to coat the probe 12 other than the probe tip. This can be achieved by first applying the resist coating 52, for example, to the entire probe 12, and then removing the portion of the resist coating 52 at the tip via a photoimaging and development step (see steps 406 and 408 shown at FIG. 4). For example, the resist coating 52 is removed up to approximately 10 mils from the probe tips so as to expose the probe tip.

As shown in FIG. 5, a container 20 with a plating solution 22 is provided. The container 20 may be formed from insulator material, and anode 26 may be located within the plating solution. The electrodes and the probes 12 are connected to a power source 34 in a similar manner as described above with respect to FIG. 2. The plating solution 22 is maintained, for example, at approximately 50 degrees C., by using water bath 38 held in glass bowl 40 warmed by hotplate 42, while the electrical system is held at approximately 4 volts and the current density at approximately 10 asf.

In order to plate the probe tips, the backing plate 18 is lowered so as to submerge the probe tips in the plating solution 22 (see step 410 of FIG. 4). Current is supplied from the power source 34 (see step 412 of FIG. 4) to cause the plating solution 22 to adhere to the probe tips in a conventional manner.

After the plating has adhered, the probes 12 are removed from the plating solution, and the resist coating 52 can be removed (see step 414 of FIG. 4) using a variety of conventional techniques, for example, through the use of a stripper bath, such as ADC 40 available from RBP Chemical Technology, Milwaukee, Wis. Alternatively, it may be removed using another exemplary material such as n-methyl pyrolidinone (NMP).

While the present invention has been described primarily in connection with certain configurations (e.g., FIGS. 2 and 5) and certain method steps (e.g., FIGS. 1 and 4), it is not limited thereto. For example, other plating/coating systems may be utilized. Further, regarding the flow diagrams of FIGS. 1 and 4, certain of the steps may be omitted, replaced, or rearranged as desired so long as the desired coating is achieved.

The present invention provides novel processes for plating only the tip of a spring probe. While the plating has been described as being applied directly to the base material, it is also contemplated that intermediate layers may also be applied to the probe using the present method or any other suitable plating method.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method for processing a plurality of test probes, wherein each test probe from the plurality of test probes includes a body portion and a tip portion, the method comprising:

lowering the plurality of test probes substantially vertically towards a container of a coating apparatus, wherein the container contains a coating fluid, to cause the tip portions of the plurality of test probes to make contact with a non-conductive fiber sheet supported by a porous ceramic plate of the coating apparatus, wherein the porous ceramic plate is in contact with the coating fluid and allows the coating fluid to contact the non-conductive fiber sheet applying an electrical current that passes through the plurality of test probes; and coating the tip portions of the plurality of test probes in contact with the non-conductive fiber sheet without coating the body portions of the plurality of test probes.

2. The method of claim 1 wherein the plurality of test probes are comprised of a first conductive material and the coating fluid is comprised of a second conductive material which, when in solid form is harder than the first conductive material.

3. The method of claim 1 further comprising forming the plurality of test probes using a lithographic process.

4. The method of claim 1 wherein the tip portion of each test probe being coated is less than 50% of the length of the test probe.

5. The method of claim 1 wherein the tip portion of each test probe being coated is less than 25% of the length of the test probe.

6. The method of claim 1 wherein the tip portion of each test probe being coated is less than 10% of the length of the test probe.

7. The method of claim 1 wherein the non-conductive fiber sheet comprises multiple layers of non-conductive fiber sheet material.

8. The method of claim 1, wherein the non-conductive fiber sheet comprises one or more of a cellulose material and a synthetic fiber.

9. The method of claim 1, wherein the non-conductive fiber sheet comprises one or more of nylon, polycarbonate and glass.

10. The method of claim 1 further comprising applying a resist material to at least the body portions of the plurality of test probes to limit the coating of the coating fluid to the tip portions of the plurality of test probes.

11. A coating system for applying a coating to a tip portion of a probe element, the coating system comprising:

a container for holding a liquid coating material; a power source for applying an electrical current that passes through the probe element a porous ceramic plate adjacent the container for receiving at least a portion of the liquid coating material during a coating process, the porous ceramic plate being configured to position at least a portion of the liquid coating material adjacent a top surface of the porous ceramic plate; and a non-conductive fiber sheet disposed on the top surface of the porous ceramic plate and in contact with the coating material, the non-conductive fiber sheet being configured to be contacted by the tip portion of the probe element to allow the tip portion to be coated without a body portion of the probe element from being coated.

12. The coating system of claim 11, wherein the non-conductive fiber sheet comprises multiple layers of non-conductive fiber sheet material.

13. The coating system of claim 11, wherein the non-conductive fiber sheet comprises one or more of a cellulose material and a synthetic fiber.

14. The coating system of claim 11, wherein the non-conductive fiber sheet comprises one or more of nylon, polycarbonate and glass.

15. The coating system of claim 11, wherein the porous ceramic plate has a porosity of about 1 micrometer to about 10 micrometers.

16. The coating system of claim 11, further comprising a layer of conductive foam disposed in the container, wherein the conductive foam layer is configured to allow the liquid coating material to pass through the conductive foam layer and wherein the conductive foam layer acts as an anode electrode in the container.

* * * * *

UNITED STATES PATENT AND TRADEMARK OFFICE
CERTIFICATE OF CORRECTION

PATENT NO. : 7,638,028 B2 Page 1 of 1
APPLICATION NO. : 11/196194
DATED : December 29, 2009
INVENTOR(S) : Bahadir Tunaboylu et al.

It is certified that error appears in the above-identified patent and that said Letters Patent is hereby corrected as shown below:

Title Page, Item (75) Inventors:

Please delete "Shandler" and insert --Chandler--.

Column 8
Claim 11: Line 24, please delete "probe element" and insert --probe element;--.

Signed and Sealed this

Tenth Day of August, 2010

David J. Kappos
*Director of the United States Patent and Trademark Office*